United States Patent
Arima et al.

(10) Patent No.: US 11,557,681 B2
(45) Date of Patent: Jan. 17, 2023

(54) SCHOTTKY BARRIER DIODE

(71) Applicants: TDK Corporation, Tokyo (JP); TAMURA CORPORATION, Tokyo (JP); Novel Crystal Technology, Inc., Saitama (JP)

(72) Inventors: Jun Arima, Tokyo (JP); Minoru Fujita, Tokyo (JP); Jun Hirabayashi, Tokyo (JP); Kohei Sasaki, Saitama (JP)

(73) Assignees: TDK CORPORATION, Tokyo (JP); TAMURA CORPORATION, Tokyo (JP); NOVEL CRYSTAL TECHNOLOGY, INC., Saitama (JP)

( * ) Notice: Subject to any disclaimer, the term of this patent is extended or adjusted under 35 U.S.C. 154(b) by 0 days.

(21) Appl. No.: 17/282,610

(22) PCT Filed: Oct. 9, 2019

(86) PCT No.: PCT/JP2019/039853
§ 371 (c)(1),
(2) Date: Apr. 2, 2021

(87) PCT Pub. No.: WO2020/085094
PCT Pub. Date: Apr. 30, 2020

(65) Prior Publication Data
US 2021/0343879 A1   Nov. 4, 2021

(30) Foreign Application Priority Data
Oct. 23, 2018 (JP) .............................. JP2018-199202

(51) Int. Cl.
*H01L 29/872* (2006.01)
*H01L 29/47* (2006.01)

(52) U.S. Cl.
CPC ............ *H01L 29/872* (2013.01); *H01L 29/47* (2013.01)

(58) Field of Classification Search
CPC ............................. H01L 29/47; H01L 29/872
(Continued)

(56) References Cited

U.S. PATENT DOCUMENTS

| 2012/0223337 A1* | 9/2012 | Terano ................. H01L 29/872 257/77 |
| 2013/0161634 A1 | 6/2013 | Disney et al. |

(Continued)

FOREIGN PATENT DOCUMENTS

| JP | 2017-045969 A | 3/2017 |
| JP | 2017-199869 A | 11/2017 |
| WO | 2018/020849 A1 | 2/2018 |

OTHER PUBLICATIONS

International Search Report issued in corresponding International Patent Application No. PCT/JP2019/039853, dated Dec. 10, 2019, with English translation.

(Continued)

*Primary Examiner* — Monica D Harrison
(74) *Attorney, Agent, or Firm* — McDermott Will & Emery LLP

(57) ABSTRACT

An object of the present invention is to provide a Schottky barrier diode less liable to cause dielectric breakdown due to concentration of an electric field. A Schottky barrier diode according to this disclosure includes a semiconductor substrate made of gallium oxide, a drift layer made of gallium oxide and provided on the semiconductor substrate, an anode electrode brought into Schottky contact with the drift layer, and a cathode electrode brought into ohmic contact with the semiconductor substrate. The drift layer has an outer peripheral trench surrounding the anode electrode in a plan view. The surface of the drift layer positioned between the anode electrode and the outer peripheral trench is (Continued)

covered with a semiconductor layer having a conductivity type opposite to that of the drift layer.

18 Claims, 16 Drawing Sheets

(58) Field of Classification Search
USPC .......................................................... 257/77
See application file for complete search history.

(56) References Cited

U.S. PATENT DOCUMENTS

| | | | |
|---|---|---|---|
| 2016/0181355 A1* | 6/2016 | Nagoaka | H01L 29/1608 |
| | | | 438/572 |
| 2018/0286684 A1 | 10/2018 | Fujii et al. | |
| 2019/0148563 A1* | 5/2019 | Sasaki | H01L 29/511 |
| | | | 257/43 |

OTHER PUBLICATIONS

Extended European Search Report issued in corresponding European Patent Application No. 19875151.3-1212, dated Jun. 13, 2022.
K. Sasaki et al., "First Demonstration of Ga2O3 Trench MOS-Type Schottky Barrier Diodes", IEEE Electron Device Letters, vol. 38, No. 6, Jun. 2017, pp. 783-785.

* cited by examiner

SCHOTTKY BARRIER DIODE

CROSS REFERENCE TO RELATED APPLICATIONS

This application is the U.S. National Phase under 35 U.S.C. § 371 of International Application No. PCT/JP2019/039853, filed on Oct. 9, 2019, which claims the benefit of Japanese Application No. 2018-199202, filed on Oct. 23, 2018, the entire contents of each are hereby incorporated by reference.

TECHNICAL FIELD

The present invention relates to a Schottky barrier diode and, more particularly, to a Schottky barrier diode using gallium oxide.

BACKGROUND ART

A Schottky barrier diode is a rectifying element utilizing a Schottky barrier generated due to bonding between metal and a semiconductor and is lower in forward voltage and higher in switching speed than a normal diode having a PN junction. Thus, the Schottky barrier diode is sometimes utilized as a switching element for a power device.

When the Schottky barrier diode is utilized as a switching element for a power device, it is necessary to ensure a sufficient backward withstand voltage, so that, silicon carbide (SiC), gallium nitride (GaN), or gallium oxide ($Ga_2O_3$) having a larger band gap is sometimes used in place of silicon (Si). Among them, gallium oxide has a very large band gap (4.8 eV to 4.9 eV) and a large breakdown field (7 MV/cm to 8 MV/cm), so that a Schottky barrier diode using gallium oxide is very promising as the switching element for a power device. An example of the Schottky barrier diode using gallium oxide is described in Patent Documents 1 to 3.

Patent Document 1 discloses a Schottky barrier diode having a field plate structure. A Schottky barrier diode described in Patent Document 2 has a structure in which a plurality of trenches are provided so as to overlap an anode electrode in a plan view, and the inner wall of each of the plurality of trenches is covered with an insulating film. With this structure, when a backward voltage is applied, a mesa region positioned between adjacent trenches becomes a depletion layer, so that a channel region of a drift layer is pinched off. Thus, a leak current upon application of the backward voltage can be significantly reduced.

Further, in a Schottky barrier diode described in Patent Document 3, a p-type oxide semiconductor layer that covers a drift layer through a nitride layer is provided to form a depletion layer in the drift layer to thereby increase a withstand voltage upon application of a backward voltage.

CITATION LIST

Patent Document

[Patent Document 1] JP 2017-045969A
[Patent Document 2] JP 2017-199869A
[Patent Document 3] International Patent Publication WO 2018/020849

SUMMARY OF INVENTION

Problem to be Solved by the Invention

However, in the Schottky barrier diodes described in Patent Documents 1 and 2, an electric field concentrates on the end portion of the anode electrode, so that when a high voltage is applied, dielectric breakdown occurs in this portion. Further, in the Schottky barrier diodes described in Patent Document 2, an electric field concentrates also on the edge part of the trench positioned at the end portion, which may cause dielectric breakdown at this portion.

In the Schottky barrier diode described in Patent Document 3, an electric field is relaxed by covering the surface of the drift layer with the p-type oxide semiconductor layer; however, the electric field concentrates on the drift layer at a part thereof that overlaps the end portion of the p-type oxide semiconductor layer, which may cause dielectric breakdown at this portion.

It is therefore an object of the present invention to provide a Schottky barrier diode using gallium oxide, which is less liable to cause dielectric breakdown due to concentration of an electric field.

Means for Solving the Problem

A Schottky barrier diode according to the present invention includes: a semiconductor substrate made of gallium oxide; a drift layer made of gallium oxide and provided on the semiconductor substrate; an anode electrode brought into Schottky contact with the drift layer; and a cathode electrode brought into ohmic contact with the semiconductor substrate. The drift layer has an outer peripheral trench surrounding the anode electrode in a plan view. The surface of the drift layer positioned between the anode electrode and the outer peripheral trench is covered with a semiconductor layer having a conductivity type opposite to that of the drift layer.

According to the present invention, the surface of the drift layer is covered with a semiconductor layer having an opposite conductivity type, so that when a backward voltage is applied, a depletion layer extends around in a part of the drift layer that is covered with the opposite conductivity type semiconductor layer. This relaxes concentration of an electric field on the corner portion of the anode electrode. In addition, the electric field concentrating on the end portion of the semiconductor layer is dispersed by the outer peripheral trench, alleviating electric field concentration on a part of the drift layer that overlaps the end portion of the semiconductor layer. Thus, there can be provided a Schottky barrier diode which is less liable to cause dielectric breakdown due to a backward voltage.

In the present invention, the semiconductor layer may be made of an oxide semiconductor material. This can prevent a change in characteristics of the semiconductor layer due to oxidation.

In the present invention, the anode electrode and the semiconductor layer may overlap each other. This can relax electric field concentration more effectively at the corner portion of the anode electrode.

In the present invention, the outer peripheral trench may be filled with an insulating material or a semiconductor material having a conductivity type opposite to that of the drift layer. In the former case, an electric force line extending in the drift layer can be blocked by the insulating material embedded in the outer peripheral trench, and in the latter case, there can be formed a depletion layer extending from the semiconductor material embedded in the outer peripheral trench to the drift layer.

In the present invention, the drift layer may further have a plurality of center trenches formed at a position overlapping the anode electrode in a plan view. In this case, the inner wall of each of the plurality of center trenches may be covered with an insulating film. With this configuration, a mesa region positioned between the adjacent center trenches becomes a depletion layer upon application of a backward voltage, so that a channel region of the drift layer is pinched off. Thus, a leak current upon application of the backward voltage can be significantly reduced.

Advantageous Effects of the Invention

As described above, according to the present invention, there can be provided a Schottky barrier diode using gallium oxide, which is less liable to cause dielectric breakdown due to concentration of an electric field.

MODE FOR CARRYING OUT THE INVENTION

Preferred embodiments of the present invention will be explained below in detail with reference to the accompanying drawings.

First Embodiment

Figure 1:
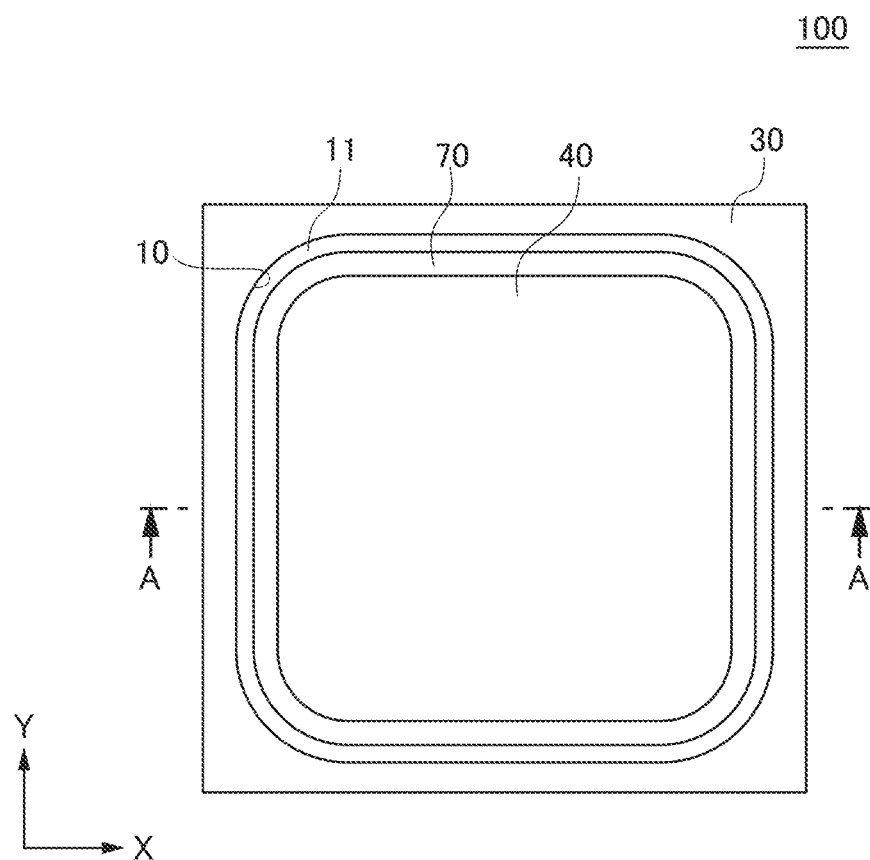
FIG. 1 is a schematic top view illustrating the configuration of a Schottky barrier diode 100 according to a first embodiment of the present invention.
Figure 2:
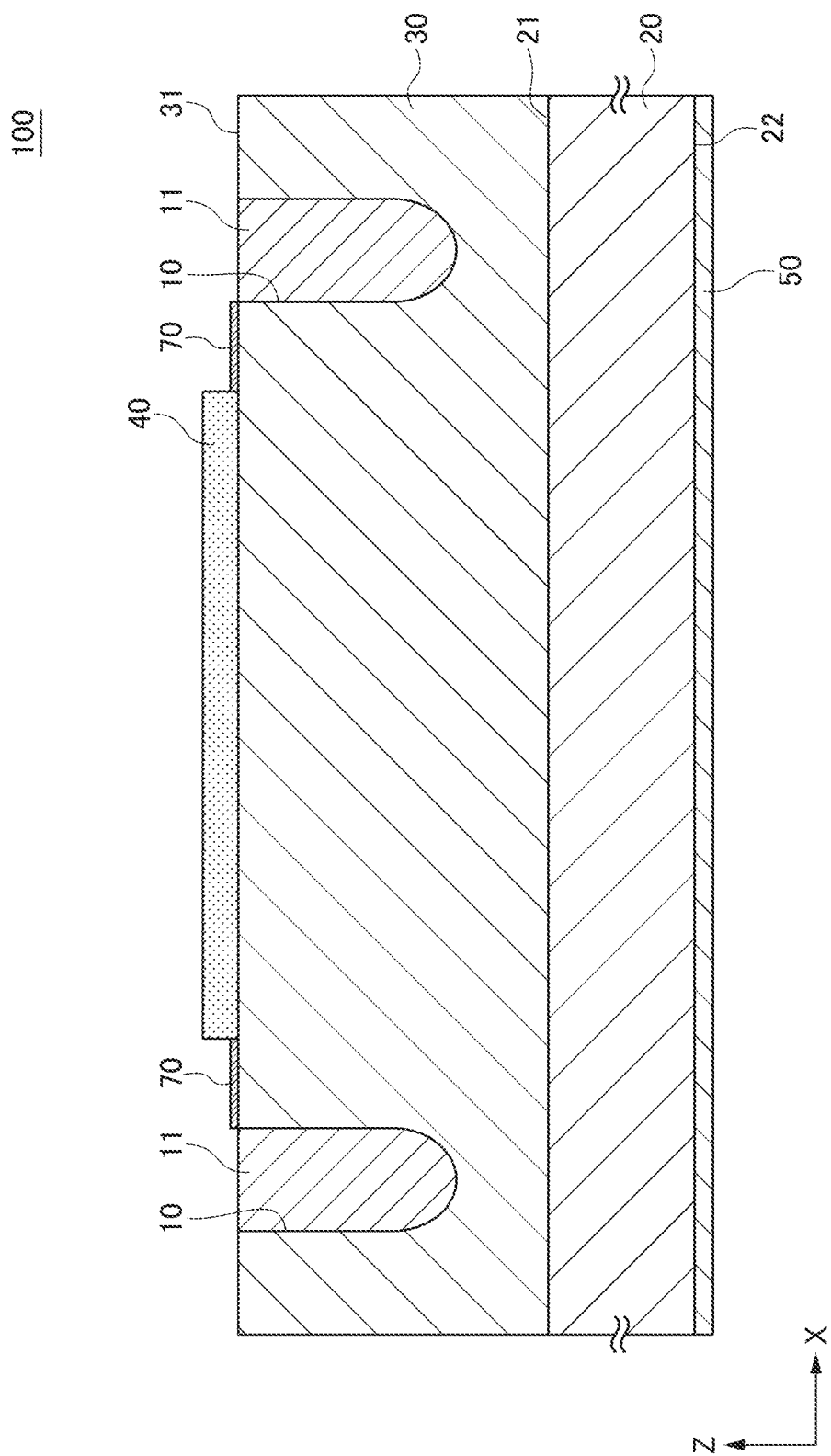
FIG. 2 is a schematic cross-sectional view taken along line A-A in FIG. 1.

FIG. 1 is a schematic top view illustrating the configuration of a Schottky barrier diode 100 according to a first embodiment of the present invention. FIG. 2 is a schematic cross-sectional view taken along line A-A in FIG. 1.

As illustrated in FIGS. 1 and 2, the Schottky barrier diode 100 according to the present embodiment includes a semiconductor substrate 20 and a drift layer 30, both of which are made of gallium oxide ($\beta$-$Ga_2O_3$). The semiconductor substrate 20 and the drift layer 30 are each introduced with silicon (Si) or tin (Sn) as an n-type dopant. The concentration of the dopant is higher in the semiconductor substrate 20 than in the drift layer 30, whereby the semiconductor substrate 20 and the drift layer 30 function as an $n^+$ layer and an $n^-$ layer, respectively.

The semiconductor substrate 20 is obtained by cutting a bulk crystal formed using a melt-growing method, and the thickness (height in the Z-direction) thereof is about 250 μm. Although there is no particular restriction on the planar size of the semiconductor substrate 20, the planar size is generally selected in accordance with the amount of current flowing in the element and, when the maximum amount of forward current is about 20 A, the widths in the X- and Y-directions may be set to about 2.4 mm.

The semiconductor substrate 20 has an upper surface 21 positioned on the upper surface side and a back surface 22 positioned on the lower surface side, in a mounted state. The drift layer 30 is formed on the entire upper surface 21. The drift layer 30 is a thin film obtained by epitaxially growing gallium oxide on the upper surface 21 of the semiconductor substrate 20 using a reactive sputtering method, a PLD method, an MBE method, an MOCVD method, or an HVPE method. Although there is no particular restriction on the film thickness of the drift layer 30, the film thickness is generally selected in accordance with the backward withstand voltage of the element and may be set to, e.g., about 7 μm in order to ensure a withstand voltage of about 600 V.

An anode electrode 40 is formed on an upper surface 31 of the drift layer 30 so as to be brought into Schottky contact with the drift layer 30. The anode electrode 40 is formed of metal such as platinum (Pt), palladium (Pd), gold (Au), nickel (Ni), or the like. The anode electrode 40 may have a multilayer structure of different metal films such as Pt/Au, Pt/Al, Pd/Au, Pd/Al, Pt/Ti/Au, or Pd/Ti/Au. On the other hand, a cathode electrode 50 is formed on the back surface 22 of the semiconductor substrate 20 so as to be brought into ohmic contact with the semiconductor substrate 20. The cathode electrode 50 is formed of metal such as titanium (Ti). The cathode electrode 50 may have a multilayer structure of different metal films such as Ti/Au or Ti/Al.

Further, the drift layer 30 has formed therein an outer peripheral trench 10 at a position not overlapping the anode electrode 40 in a plan view (as viewed in the Z-direction) so as to surround the anode electrode 40. The outer peripheral trench 10 can be formed by etching the drift layer 30 from the upper surface 31 side.

The outer peripheral trench 10 is filled with an embedded layer 11. The embedded layer 11 may be an insulating material such as $SiO_2$ or a semiconductor material having a conductivity type opposite to that of the drift layer 30. That is, when the semiconductor material is used as the material of the embedded layer 11, a p-type semiconductor material needs to be selected since the conductivity type of the drift layer 30 is an n-type. The semiconductor material filled in the outer peripheral trench 10 may be in a floating state.

Further, a part of the surface of the drift layer 30 positioned between the anode electrode 40 and the outer peripheral trench 10 is covered with a semiconductor layer 70 having a conductivity type opposite to that of the drift layer 30. The drift layer 30 and the semiconductor layer 70 may directly contact each other, or may contact each other through an insulating film or the like. Since the conductivity type of the drift layer 30 is an n-type, the semiconductor layer 70 needs to be formed of a p-type semiconductor material. Examples of the p-type semiconductor material include Si, GaAs, SiC, Ge, ZnSe, CdS, InP, SiGe, and a p-type oxide semiconductor such as NiO, $Cu_2O$, or $Ag_2O$. The p-type semiconductor material has an advantage of being free from oxidation. In particular, NiO is a special material that exhibits only a p-type conductivity and is most preferable in terms of quality stabilization. Further, NiO has a band gap as large as 3.7 eV and is thus desirable as a material taking advantage of high withstand voltage of gallium oxide. Further, to control acceptor concentration, Li or La may be added as a dopant in a ratio of about 0.2 mol % to 1.0 mol % to NiO (99.9%). The acceptor concentration is preferably equal to or higher than $5\times10^{17}$ cm$^{-3}$ and more preferably equal to or higher than $5\times10^{18}$ cm$^{-3}$ in terms of production stability. This is because a low acceptor concentration may cause depletion of the semiconductor layer 70, which may fail to provide a desired function. Thus, a higher acceptor concentration is more preferable. However, when the acceptor concentration exceeds $1\times10^{22}$ cm$^{-3}$, film characteristics may deteriorate, so that the acceptor concentration is preferably equal to or lower than about $5\times10^{21}$ cm$^{-3}$. The semiconductor layer 70 may be in a floating state, or may contact the anode electrode 40 or the embedded layer 11 embedded in the outer peripheral trench 10. The surface of the semiconductor layer 70 is preferably covered with a passivation film of $SiO_2$ or the like.

When in a fully amorphous state, the p-type oxide constituting the semiconductor layer 70 is unintentionally crystallized in a heating process during device production, which may make the characteristics thereof unstable. Considering this, at the time when the p-type oxide is formed on the drift layer 30, about 50% by volume thereof may be crystallized, for example. This can reduce the influence of crystallization in a heat process during device production.

Figure 3:
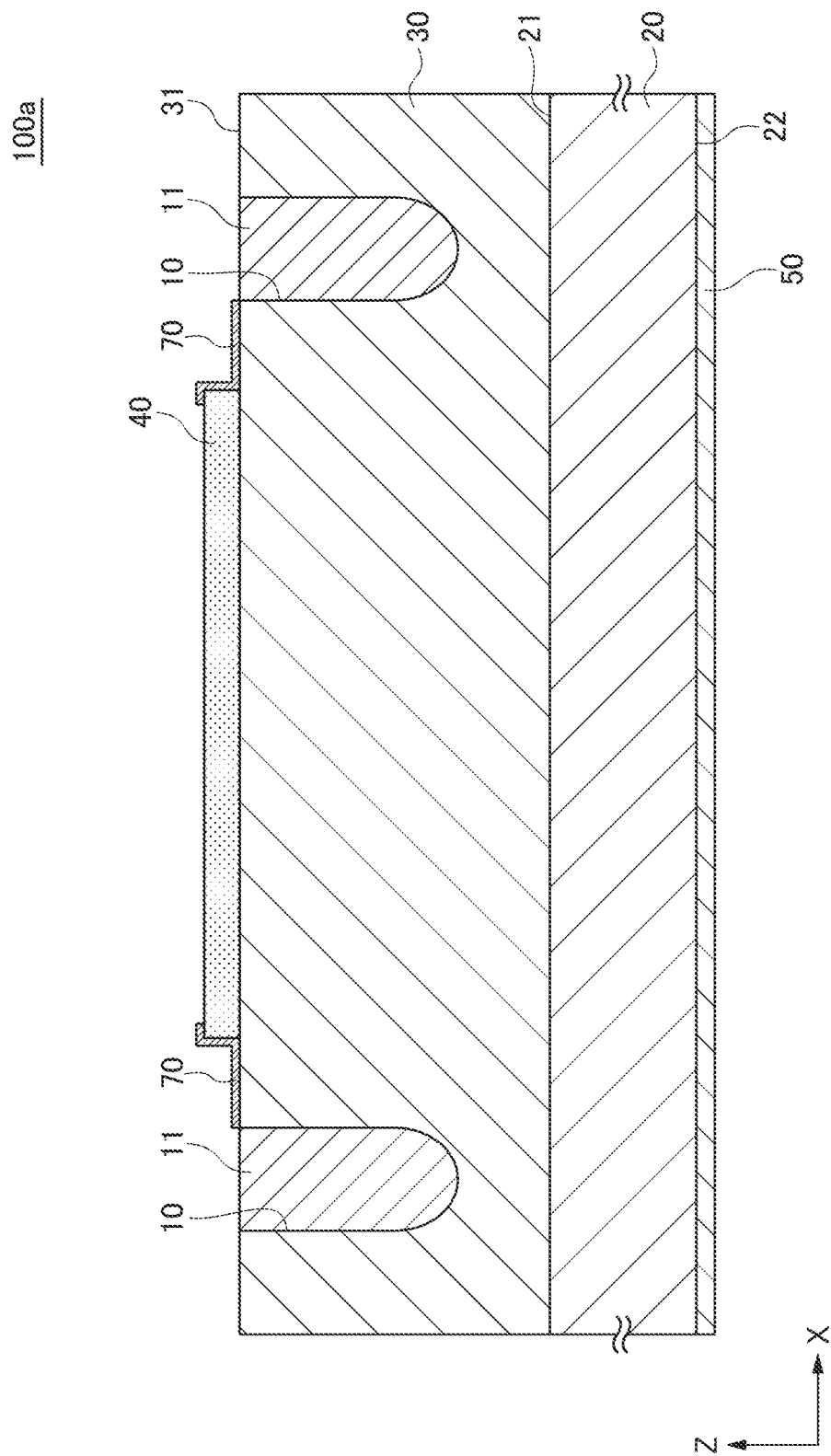
FIG. 3 is a schematic cross-sectional view illustrating the configuration of a Schottky barrier diode 100a according to a first modification of the first embodiment.
Figure 4:
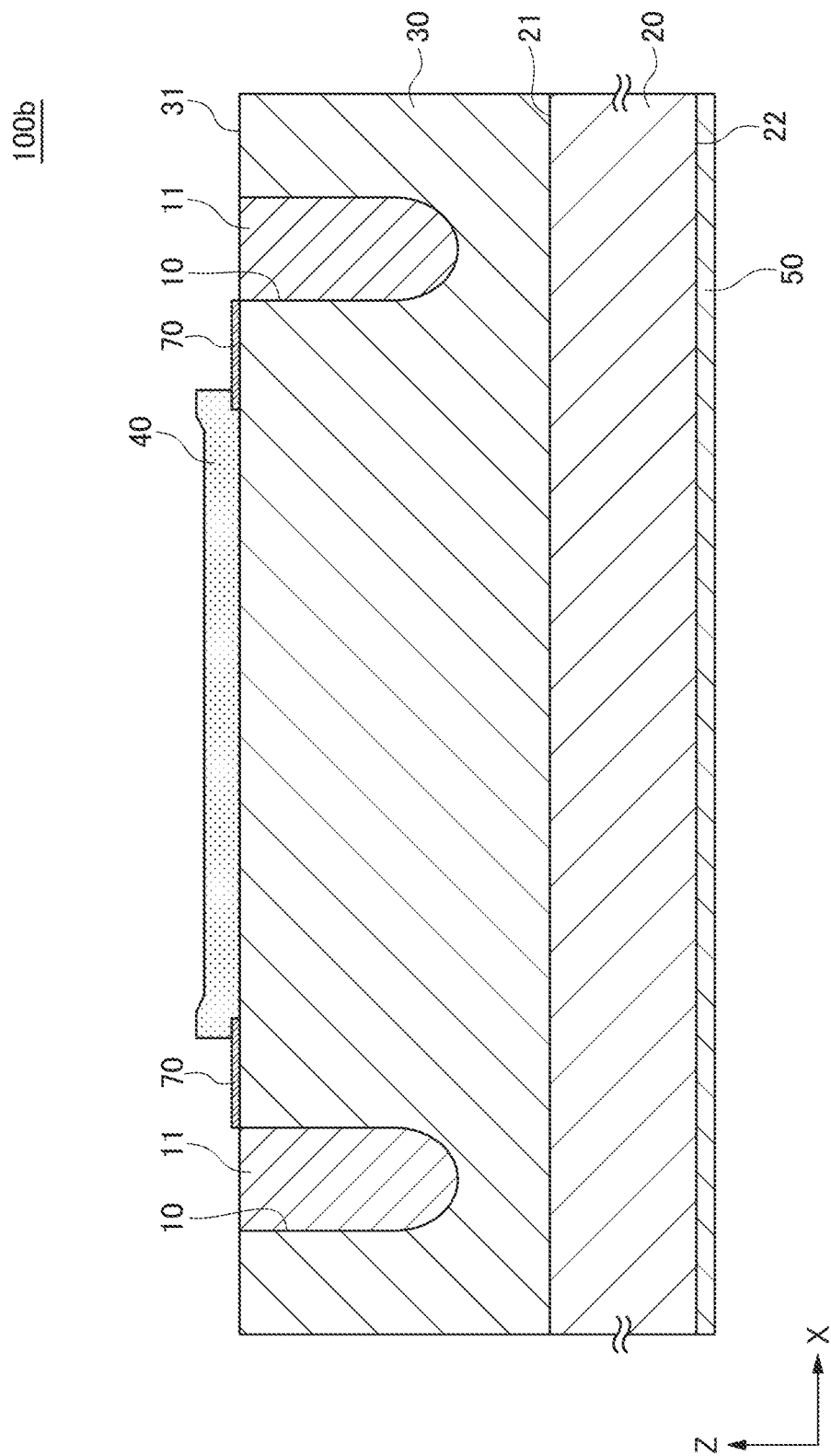
FIG. 4 is a schematic cross-sectional view illustrating the configuration of a Schottky barrier diode 100b according to a second modification of the first embodiment.

Since the semiconductor layer 70 has a conductivity type opposite to that of the drift layer 30, a depletion layer extends around a part of the drift layer 30 that is covered with the semiconductor layer 70 due to a potential difference. Thus, when a backward voltage is applied between the anode electrode 40 and the cathode electrode 50, an electric field concentrating on the end portion of the anode electrode 40 is relaxed. The electric field concentrating on the end portion of the anode electrode 40 is relaxed more effectively as a gap between the anode electrode 40 and the semiconductor layer 70 is smaller, so that the anode electrode 40 and the semiconductor layer 70 preferably contact each other. When it is difficult to make the outer peripheral edge of the anode electrode 40 and the inner peripheral edge of the semiconductor layer 70 coincide with each other, a part of the semiconductor layer 70 may be formed on the anode electrode 40 so as to cover the outer peripheral edge of the anode electrode 40 as in a Schottky barrier diode 100a according to a first modification (FIG. 3). Alternatively, a part of the anode electrode 40 may be formed on the semiconductor layer 70 so as to cover the inner peripheral edge of the semiconductor layer 70 as in a Schottky barrier diode 100b according to a second modification (FIG. 4). With the above configurations, an overlap occurs between the anode electrode 40 and the semiconductor layer 70, allowing the anode electrode 40 and semiconductor layer 70 to reliably contact each other.

Figure 5:
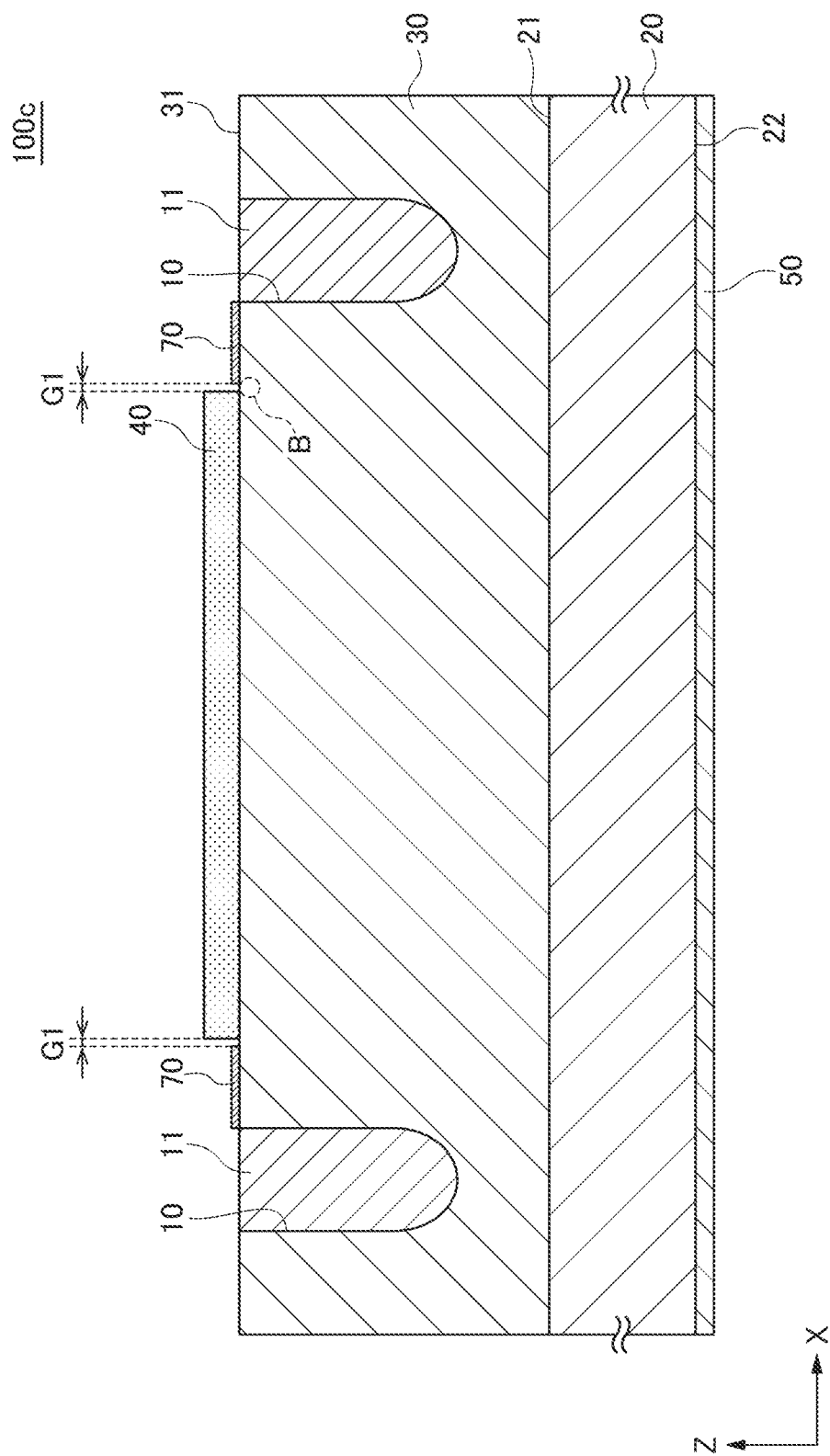
FIG. 5 is a schematic cross-sectional view illustrating the configuration of a Schottky barrier diode 100c according to a third modification of the first embodiment.

However, in the present invention, it is not essential to make the anode electrode 40 and the semiconductor layer 70 contact each other, but a gap G1 may exist between the outer peripheral edge of the anode electrode 40 and the inner peripheral edge of the semiconductor layer 70 as in a Schottky barrier diode 100c according to a third modification (FIG. 5). The electric field concentrating on the end portion of the anode electrode 40 becomes stronger as the gap G1 is larger, so that the gap G1 should preferably be as small as possible.

As described above, the electric field concentrating on the end portion of the anode electrode 40 is relaxed by providing the semiconductor layer 70. In this case, the electric field concentrates on the outer peripheral edge of the semiconductor layer 70, which, however, is relaxed by the outer peripheral trench 10. Thus, in the present embodiment, the electric field concentrating on the end portion of the anode electrode 40 is relaxed by the semiconductor layer 70, and the electric field concentrating on the outer peripheral edge of the semiconductor layer 70 is relaxed by the outer peripheral trench 10, thereby making it possible to prevent dielectric breakdown upon application of a backward voltage.

Figure 6:
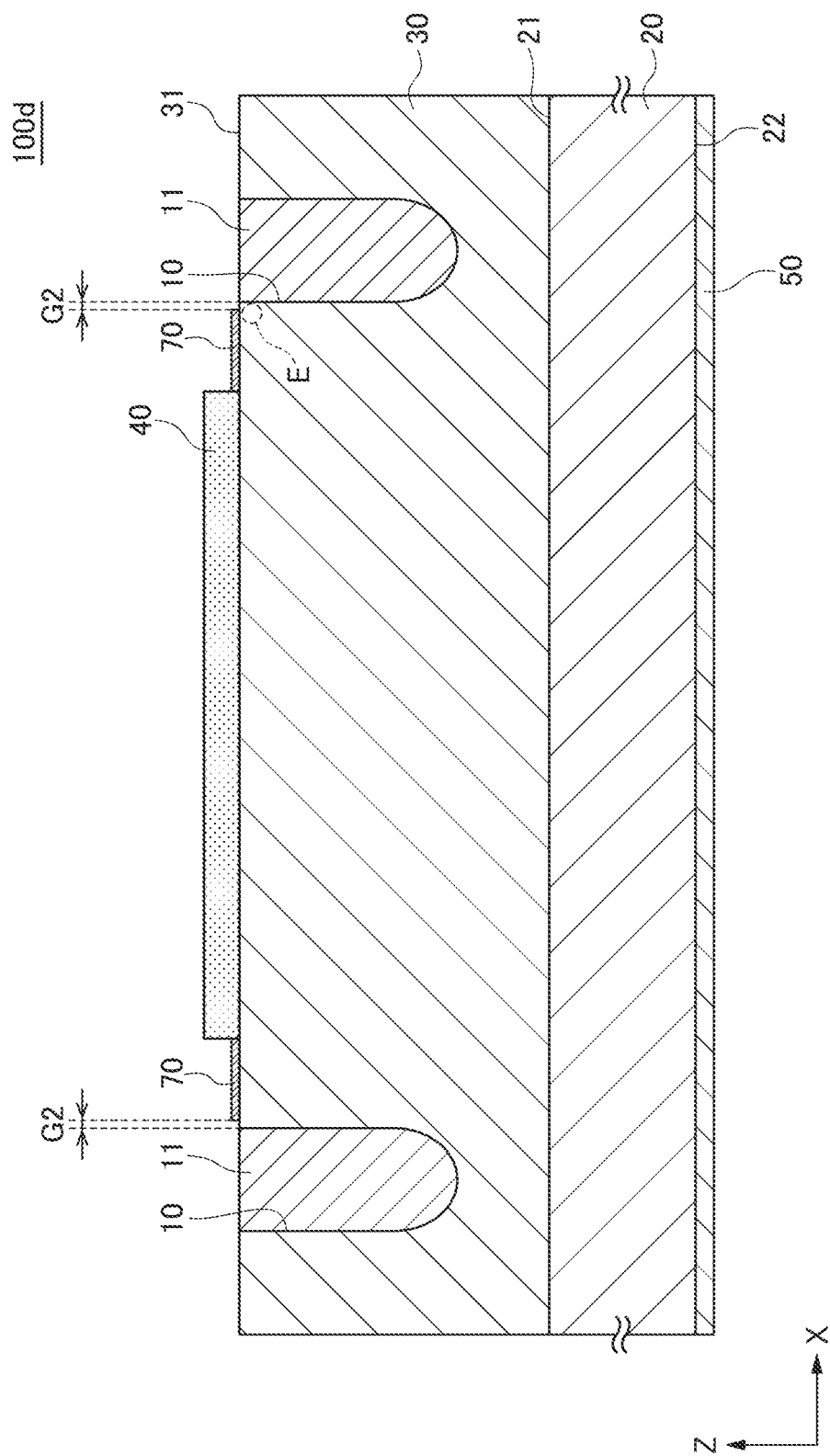
FIG. 6 is a schematic cross-sectional view illustrating the configuration of a Schottky barrier diode 100d according to a fourth modification of the first embodiment.

The electric field concentrating on the outer peripheral edge of the semiconductor layer 70 is relaxed more effectively as a gap between the outer peripheral edge of the semiconductor layer 70 and the inner peripheral edge of the outer peripheral trench 10 is smaller, so that it is preferable that the outer peripheral edge of the semiconductor layer 70 and the inner peripheral edge of the outer peripheral trench 10 coincide with each other. When the embedded layer 11 in the outer peripheral trench 10 is made of the same material as that of the semiconductor layer 70, the semiconductor layer 70 and embedded layer 11 may be continuously formed. However, in the present invention, it is not essential to make the outer peripheral edge of the semiconductor layer 70 and the inner peripheral edge of the outer peripheral trench 10 coincide with each other, but a gap G2 may exist between the outer peripheral edge of the semiconductor layer 70 and the inner peripheral edge of the outer peripheral trench 10 as in a Schottky barrier diode 100d according to a fourth modification (FIG. 6). The electric field concentrating on the outer peripheral edge of the semiconductor layer 70 becomes stronger as the gap G2 is larger, so that the gap G2 should preferably be made as small as possible.

Figure 7:
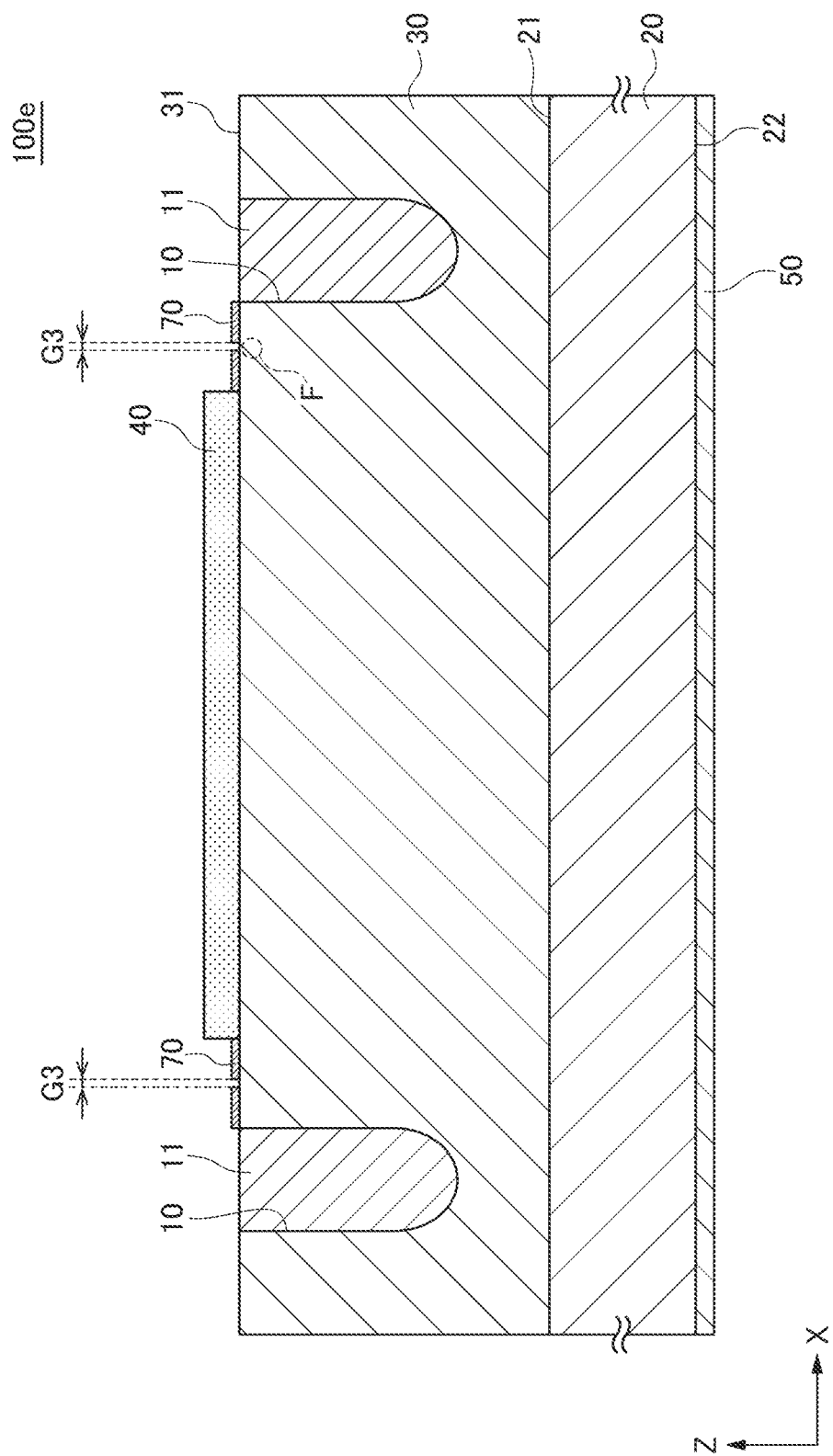
FIG. 7 is a schematic cross-sectional view illustrating the configuration of a Schottky barrier diode 100e according to a fifth modification of the first embodiment.

The semiconductor layer 70 need not be a completely continuous film, but a slit or a cut may be formed in the semiconductor layer 70 so as to partially expose the drift layer 30 therethrough as in a Schottky barrier diode 100e according to a fifth modification (FIG. 7). However, when the slit or cut exists in the semiconductor layer 70, an electric field concentrates on this portion, so that a gap G3 generated by the slit or cut should preferably be as small as possible.

Figure 8:
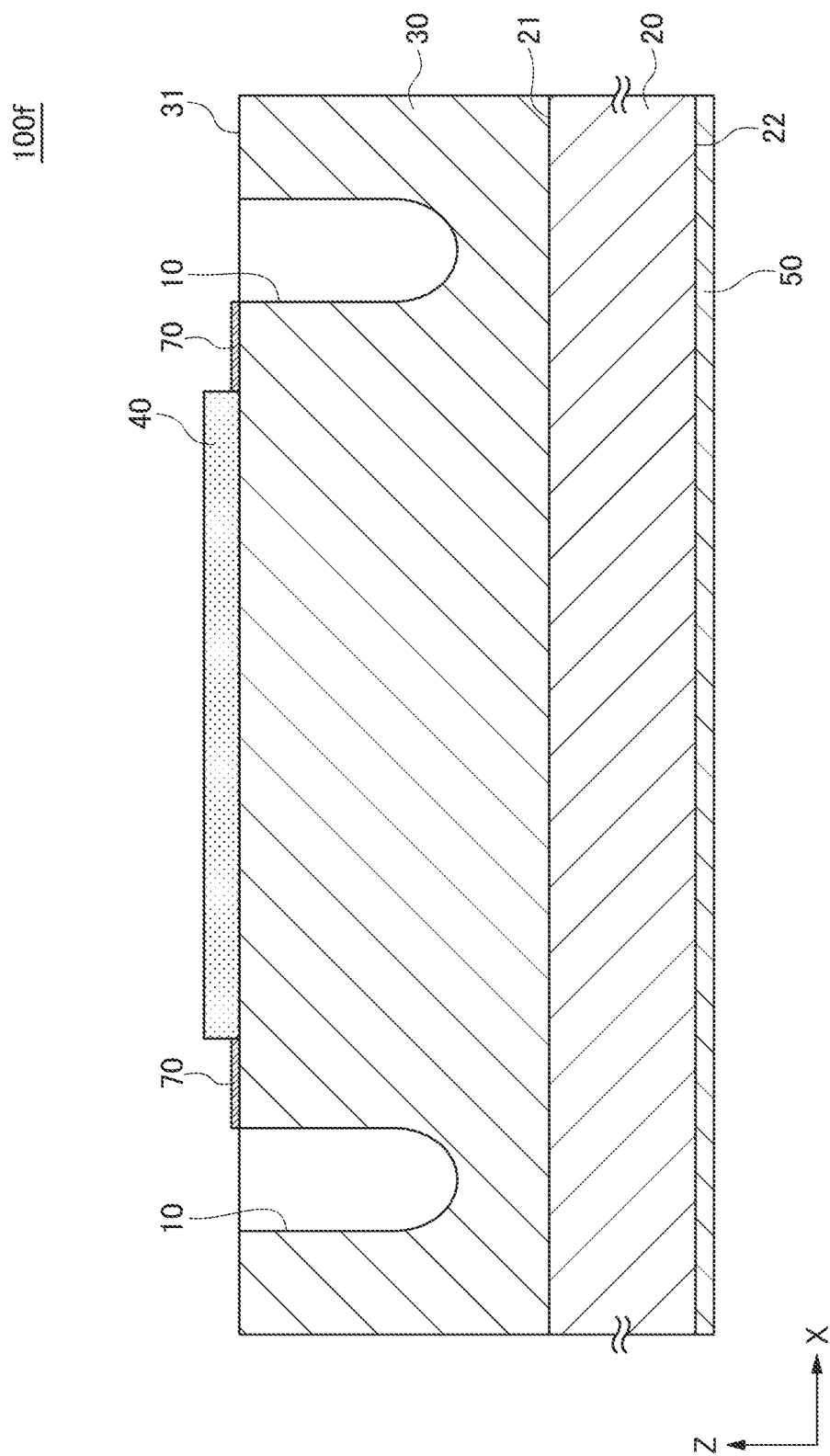
FIG. 8 is a schematic cross-sectional view illustrating the configuration of a Schottky barrier diode 100f according to a sixth modification of the first embodiment.

Further, the outer peripheral trench 10 need not be filled with the embedded layer 11 but may be hollow as in a Schottky barrier diode 100f according to a sixth modification (FIG. 8). In this case as well, the electric field concentrating on the outer peripheral edge of the semiconductor layer 70 is relaxed by the outer peripheral trench 10.

As described above, in the Schottky barrier diode 100 according to the present embodiment, the surface of the drift layer 30 positioned between the anode electrode 40 and the outer peripheral trench 10 is covered with the semiconductor layer 70 having a conductivity type opposite to that of the drift layer 30. Thus, the electric field concentrating on the end portion of the anode electrode 40 is relaxed by a depletion layer that extends due to the existence of semiconductor layer 70, and the electric field concentrating on the outer peripheral edge of the semiconductor layer 70 is relaxed by the outer peripheral trench 10. This can prevent dielectric breakdown due to electric field concentration.

Second Embodiment

Figure 9:
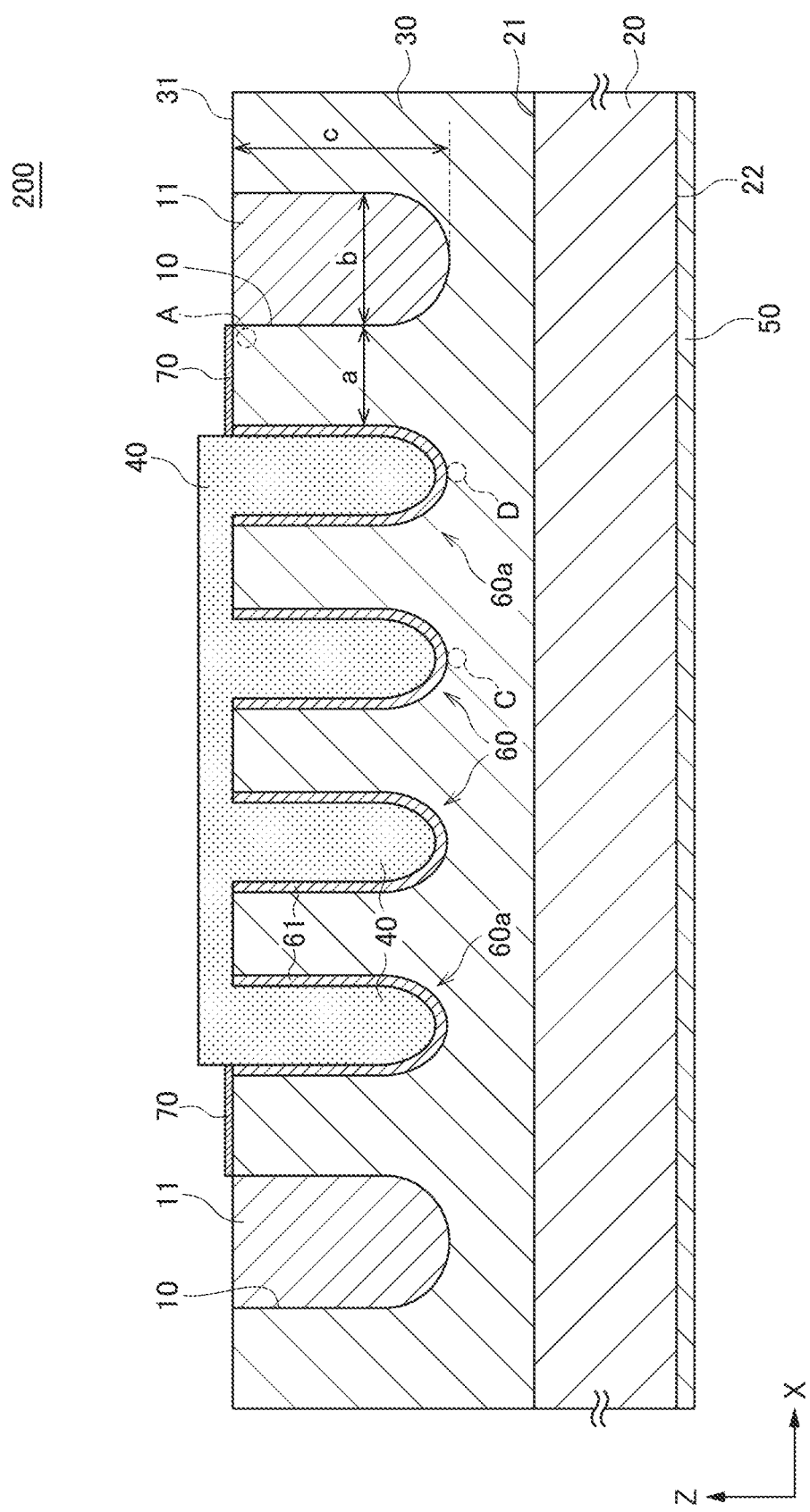
FIG. 9 is a schematic cross-sectional view illustrating the configuration of a Schottky barrier diode 200 according to a second embodiment of the present invention.

FIG. 9 is a schematic cross-sectional view illustrating the configuration of a Schottky barrier diode 200 according to a second embodiment of the present invention.

As illustrated in FIG. 9, in the Schottky barrier diode 200 according to the second embodiment, a plurality of center trenches 60 are formed in the drift layer 30. The center trenches 60 are all formed at a position overlapping the anode electrode 40 in a plan view. The inner wall of each of the center trenches 60 is covered with an insulating film 61 made of $HfO_2$ or the like. The conductive material filled in the center trench 60 may be the same as that of the anode electrode 40 or may be a highly doped polycrystalline Si or a metal material such as Ni or Au. In the present embodiment, the plurality of center trenches 60 are formed in the drift layer 30, so that the anode electrode 40 may be made of a material having a low work function, such as molybdenum (Mo) or copper (Cu). Further, in the present embodiment, the dopant concentration of the drift layer 30 can be increased up to about $5 \times 10^{16}$ $cm^{-3}$. Other configurations are basically the same as those of the Schottky barrier diode 100 according to the first embodiment, so the same reference numerals are given to the same elements, and overlapping description will be omitted.

Apart of the drift layer 30 positioned between the adjacent center trenches 60 constitutes a mesa region. The mesa region becomes a depletion layer when a backward voltage is applied between the anode electrode 40 and the cathode electrode 50, so that a channel region of the drift layer 30 is pinched off. Thus, a leak current upon application of the backward voltage is significantly reduced.

In the Schottky barrier diode having such a structure, an electric field concentrates on the bottom portion of a center trench 60a positioned at the end portion, making it more susceptible to dielectric breakdown at this portion. However, in the Schottky barrier diode 200 according to the present embodiment, the surface of the drift layer 30 is covered with the semiconductor layer 70 and the outer peripheral trench 10 is formed at the outer periphery of the center trenches 60 so as to surround the center trenches 60, and hence the electric field concentrating on the center trench 60a at the end portion is relaxed.

As described above, the Schottky barrier diode 200 according to the present embodiment has an effect that can reduce a leak current upon application of a backward voltage, in addition to the effect obtained by the Schottky barrier diode 100 according to the first embodiment. Further, in the present embodiment, the outer peripheral trench 10 and the center trench 60 have the same depth, and thus, they can be formed in the same process.

Further, although the inner wall of the center trench 60 is covered with the insulating film 61, and the inside thereof is filled with the same material as the anode electrode 40 in the present embodiment, the inside of the center trench 60 may be filled with a semiconductor material of an opposite conductivity type (p-type, in the present embodiment) without the use of the insulating film 61.

While the preferred embodiments of the present invention have been described, the present invention is not limited to the above embodiments, and various modifications may be made within the scope of the present invention, and all such modifications are included in the present invention.

Example 1

A simulation model of Example 1 having the same structure as that of the Schottky barrier diode 200 illustrated in FIG. 9 was assumed, and electric field strength was simulated with a backward voltage applied between the anode electrode 40 and the cathode electrode 50. The material of the anode electrode 40 was Mo, and the cathode electrode 50 was a laminated film of Ti and Au. The dopant concentration of the semiconductor substrate 20 was set to $1 \times 10^{18}$ $cm^{-3}$ and the dopant concentration of the drift layer 30 was to $5 \times 10^{16}$ $cm^{-9}$. The thickness of the drift layer 30 was set to 7 µm. The outer peripheral trench 10 was hollow. The depth and width of the center trench 60 were set to 3 µm and 1 µm, respectively, the mesa width of the mesa region was set to 2 µm, and the insulating film 61 formed on the inner wall of the center trench 60 was an $HfO_2$ film having a thickness of 50 nm. The semiconductor layer 70 was NiO having an acceptor concentration of $1 \times 10^{19}$ $cm^{-9}$ and the thickness thereof was set to 100 nm. The width a of the semiconductor layer 70 and the width b and depth c of the outer peripheral trench 10 were set to 10 µm, 10 µm, and 3 µm, respectively.

Figure 10:
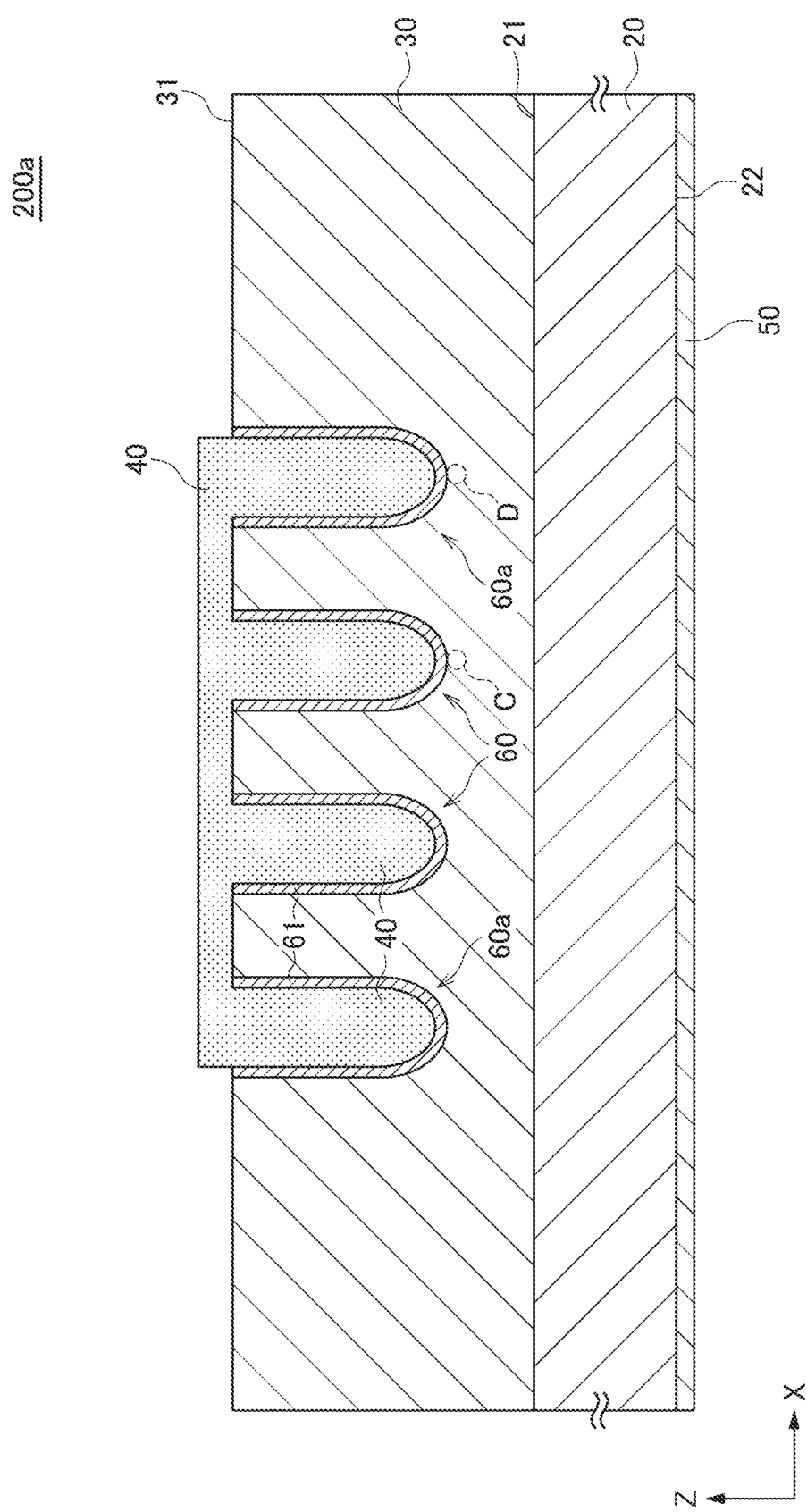
FIG. 10 is a schematic cross-sectional view illustrating the configuration of a Schottky barrier diode 200a according to a Comparative Example.

For comparison, a simulation model of Comparative Example having the same structure as a Schottky barrier diode 200a illustrated in FIG. 10 was assumed, and electric field strength was simulated with a backward voltage applied between the anode electrode 40 and the cathode electrode 50. The Schottky barrier diode 200a illustrated in FIG. 10 differs from the Schottky barrier diode 200 illustrated in FIG. 9 in that the semiconductor layer 70 and outer peripheral trench 10 are removed.

Figure 11:
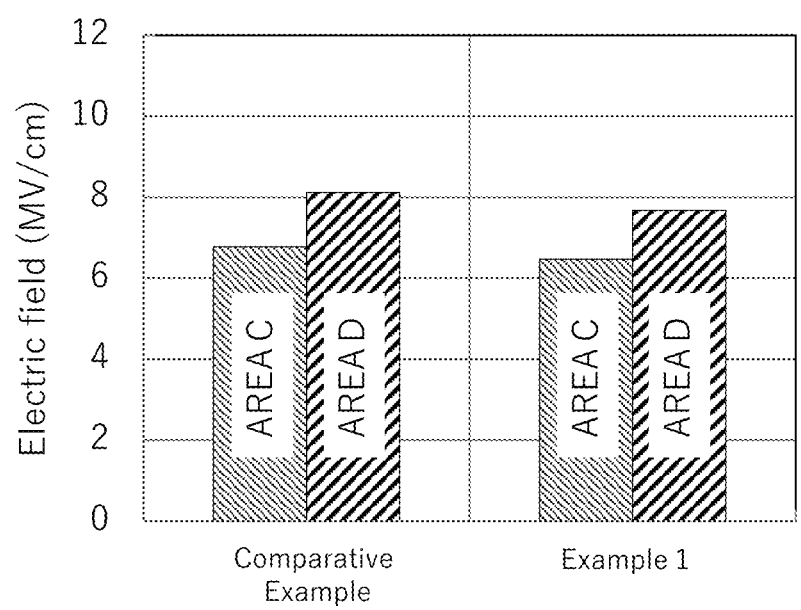
FIG. 11 is a graph indicating a simulation result of an Example 1.

FIG. 11 illustrates the strength of the electric field applied to areas C and D illustrated in FIGS. 9 and 10. The area C is an area immediately below the center trench 60 positioned at a location other than the end portion, and the area D is an area immediately below the center trench 60a positioned at the end portion.

As illustrated in FIG. 11, the strength of the electric field applied to the area C was 6.5 MV/cm in the simulation model of Example 1 and 6.8 MV/cm in the simulation model of Comparative Example. On the other hand, the strength of the electric field applied to the area D was 7.7 MV/cm in the simulation model of Example 1 and 8.1 MV/cm in the simulation model of Comparative Example. Thus, the electric field strength exceeds about 8 MV/cm, which is the withstand voltage of gallium oxide, in the simulation model of Comparative Example, while it does not exceed about 8 MV/cm in the simulation model of Example 1.

Example 2

A simulation model of Example 2 having the same configuration as the simulation model of Example 1 was assumed, and electric field strength was simulated with a backward voltage applied between the anode electrode 40 and the cathode electrode 50 while the width a of the semiconductor layer 70, i.e., the distance between the anode electrode 40 and the outer peripheral trench 10 was variously changed. The width b and depth c of the outer peripheral trench 10 were set to 10 μm and 3 μm, respectively.

Figure 12:
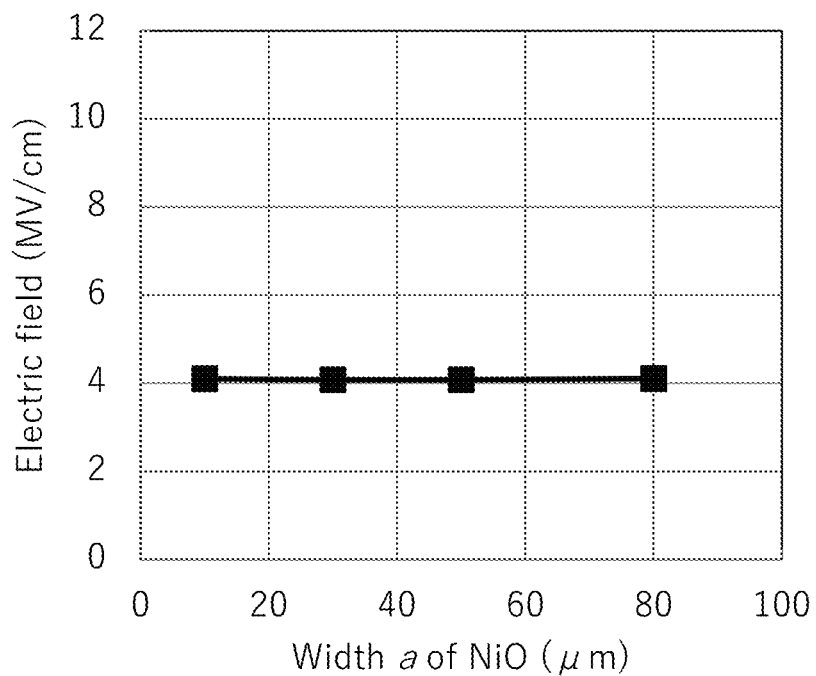
FIG. 12 is a graph indicating a simulation result of an Example 2.

FIG. 12 is a graph illustrating the simulation result of Example 2. The values in the graph of FIG. 12 denote the strength of the electric field applied to a part of the drift layer 30 that covers the outer peripheral edge of the semiconductor layer 70, i.e., an area A in FIG. 9. As illustrated in the graph of FIG. 12, the strength of the electric field applied to the area A hardly changes even with a change in the width a of the semiconductor layer 70 and is 4.1 MV/cm.

Example 3

A simulation model of Example 3 having the same configuration as the simulation model of Example 1 was assumed, and electric field strength was simulated with a backward voltage applied between the anode electrode 40 and the cathode electrode 50 while the width b of the outer peripheral trench 10 was variously changed. The width a of the semiconductor layer 70 and the depth c of the outer peripheral trench 10 were set to 10 μm and 3 μm, respectively.

Figure 13:
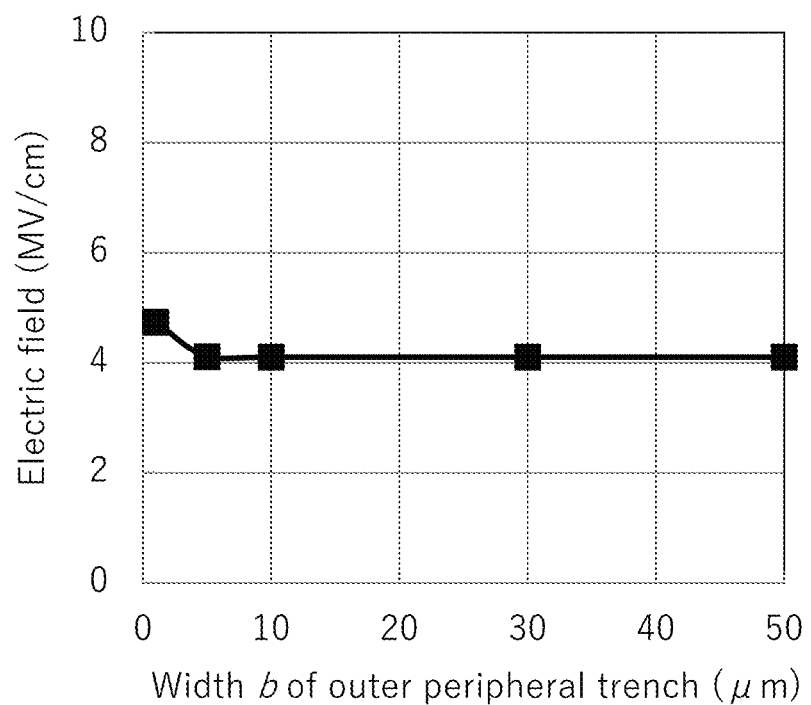
FIG. 13 is a graph indicating a simulation result of an Example 3.

FIG. 13 is a graph illustrating the simulation result of Example 3. The values in the graph of FIG. 13 also denote the strength of the electric field applied to the area A in FIG. 9. As illustrated in the graph of FIG. 13, the strength of the electric field applied to the area A hardly changes even with a change in the width b of the outer peripheral trench 10 as long as the width b of the outer peripheral trench 10 is 5 μm or more and is 4.1 MV/cm. On the other hand, when the width b of the outer peripheral trench 10 is 1 μm, the strength of the electric field applied to the area A is 4.7 MV/cm. Thus, the width b of the outer peripheral trench 10 is preferably 5 μm or more.

Example 4

A simulation model of Example 4 having the same configuration as the simulation model of Example 1 was assumed, and electric field strength was simulated with a backward voltage applied between the anode electrode 40 and the cathode electrode 50 while the depth c of the outer peripheral trench 10 was variously changed. The width a of the semiconductor layer 70 and the width b of the outer peripheral trench 10 were set to 10 μm and 10 μm, respectively.

Figure 14:
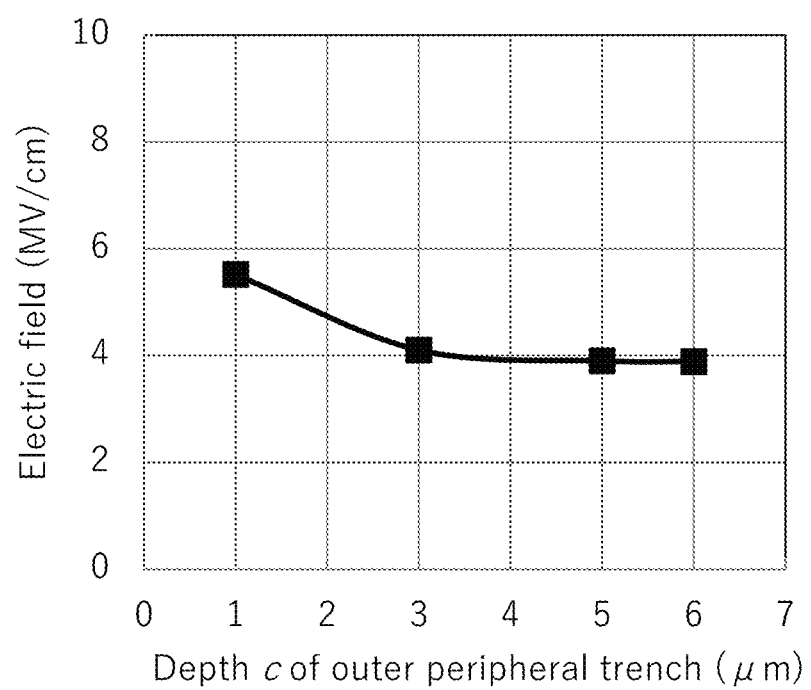
FIG. 14 is a graph indicating a simulation result of an Example 4.

FIG. 14 is a graph illustrating the simulation result of Example 4. The values in the graph of FIG. 14 also denote the strength of the electric field applied to the area A in FIG. 9. As illustrated in the graph of FIG. 14, the strength of the electric field applied to the area A hardly changes even with a change in the depth c of the outer peripheral trench 10 as long as the depth c of the outer peripheral trench 10 is 3 μm or more and is 3.9 MV/cm to 4.1 MV/cm. On the other hand, when the depth c of the outer peripheral trench 10 is 1 μm, the strength of the electric field applied to the area A is 5.5 MV/cm. Thus, the width b of the outer peripheral trench 10 is preferably equal to or more than the depth of the center trench 60 (in this example, 3 μm or more).

Example 5

A simulation model of Example 5 having the same configuration as the simulation model of Example 1 was assumed, and electric field strength was simulated with a backward voltage applied between the anode electrode 40 and the cathode electrode 50 while the gap G1 illustrated in FIG. 5 was variously changed. The width a of the semiconductor layer 70 and the width b and depth of the outer peripheral trench 10 were set to 30 μm, 10 μm, and 3 μm, respectively.

Figure 15:
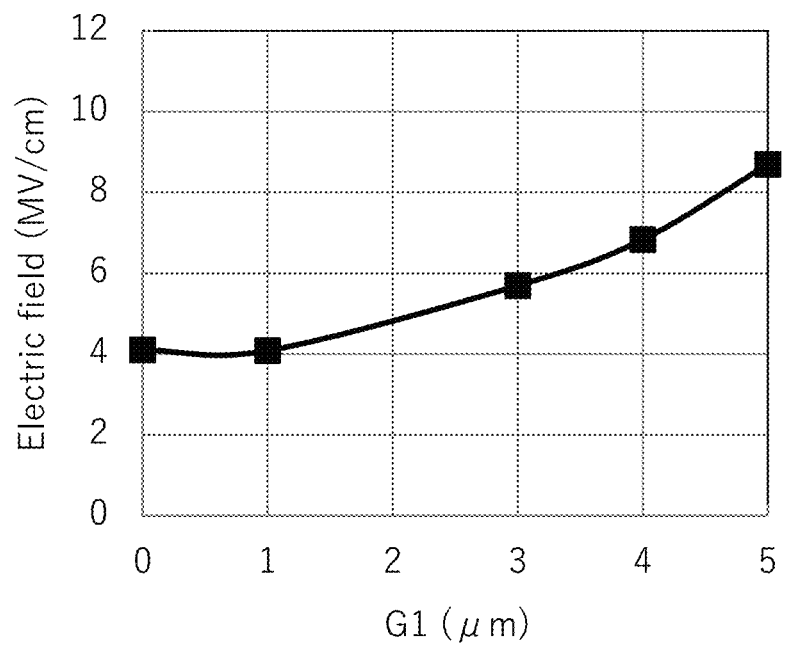
FIG. 15 is a graph indicating a simulation result of an Example 5.
Figure 16:
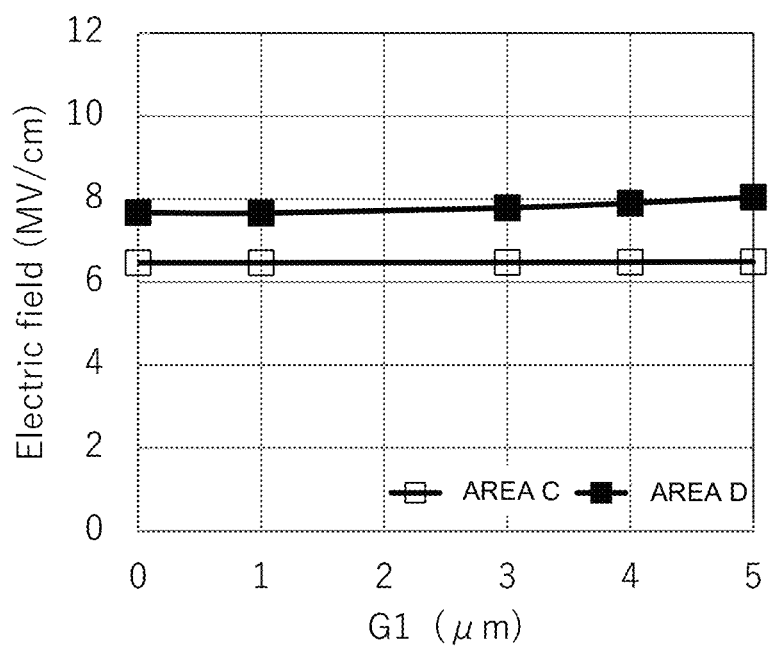
FIG. 16 is a graph indicating a simulation result of an Example 5.

FIGS. 15 and 16 are each a graph illustrating the simulation result of Example 5. The values in the graph of FIG. 15 denote the strength of the electric field applied to an area B in FIG. 5, and the values in the graph of FIG. 16 denote the strength of the electric field applied to the areas C and D in FIG. 9. The area B is an area immediately below the gap G1, the area C is an area immediately below the center trench 60 positioned at a location other than the end portion, and the area D is an area immediately below the center trench 60a positioned at the end portion. As illustrated in FIG. 15, the electric field applied to the area B becomes stronger as the gap G1 increases. Specifically, when the gap G1 is 4 μm, the electric field strength is 6.8 MV/cm, and when the gap G1 is 5 μm, the electric field strength is 8.7 MV/cm. Similarly, as illustrated in FIG. 16, the electric field applied to the area D becomes stronger as the gap G1 is larger. Specifically, when the gap G1 is 4 μm, the electric field strength is 7.9 MV/cm, and when the gap G1 is 5 μm, the electric field strength is 8.0 MV/cm. Thus, considering that the withstand voltage of gallium oxide is about 8 MV/cm, the gap G1 is preferably 4 μm or less.

Example 6

A simulation model of Example 6 having the same configuration as the simulation model of Example 1 was assumed, and electric field strength was simulated with a backward voltage applied between the anode electrode 40 and the cathode electrode 50 while the gap G2 illustrated in FIG. 6 was variously changed. The width a of the semiconductor layer 70 and the width b and depth of the outer peripheral trench 10 were set to 30 μm, 10 μm, and 3 μm, respectively.

Figure 17:
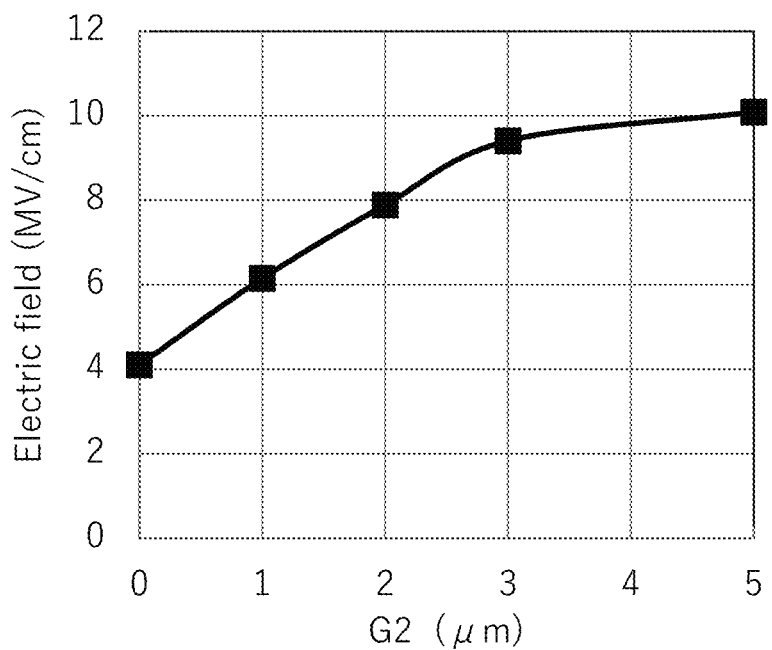
FIG. 17 is a graph indicating a simulation result of an Example 6.

FIG. 17 is a graph illustrating the simulation result of Example 6. The values in the graph of FIG. 17 denote the strength of the electric field applied to an area E in FIG. 6. The area E is an area immediately below the gap G2. As illustrated in FIG. 17, the electric field applied to the area E becomes stronger as the gap G2 is larger. Specifically, when the gap G2 is 2 μm, the electric field strength is 7.9 MV/cm, and when the gap G2 is 3 μm, the electric field strength is 9.4 MV/cm. Thus, considering that the withstand voltage of gallium oxide is about 8 MV/cm, the gap G2 is preferably 2 μm or less.

Example 7

A simulation model of Example 7 having the same configuration as the simulation model of Example 1 was assumed, and electric field strength was simulated with a backward voltage applied between the anode electrode 40 and the cathode electrode 50 while a gap G3 illustrated in FIG. 7 was variously changed. The width a of the semiconductor layer 70 and the width b and depth of the outer peripheral trench 10 were set to 30 μm, 10 μm, and 3 μm, respectively.

Figure 18:
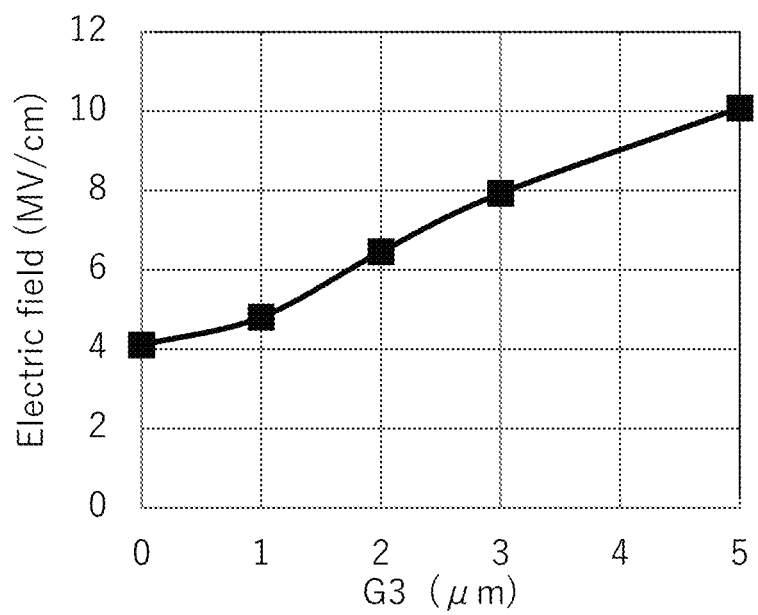
FIG. 18 is a graph indicating a simulation result of an Example 7.

FIG. 18 is a graph illustrating the simulation result of Example 7. The values in the graph of FIG. 18 denote the strength of the electric field applied to an area F in FIG. 7. The area F is an area immediately below the gap G3. As illustrated in FIG. 18, the electric field applied to the area F becomes stronger as the gap G3 is larger. Specifically, when the gap G3 is 3 µm, the electric field strength is 7.9 MV/cm, and when the gap G3 is 5 µm, the electric field strength is 10.1 MV/cm. Thus, considering that the withstand voltage of gallium oxide is about 8 MV/cm, the gap G3 is preferably 3 µm or less.

Example 8

A simulation model of Example 8 having the same configuration as that of the simulation model of Example 1 was assumed, and electric field strength was simulated with a backward voltage applied between the anode electrode 40 and the cathode electrode 50 while the material of the embedded layer 11 in the outer peripheral trench 10 was variously changed. The width a of the semiconductor layer 70 and the width b and depth of the outer peripheral trench 10 were set to 10 µm, 10 µm, and 3 µm, respectively.

Figure 19:
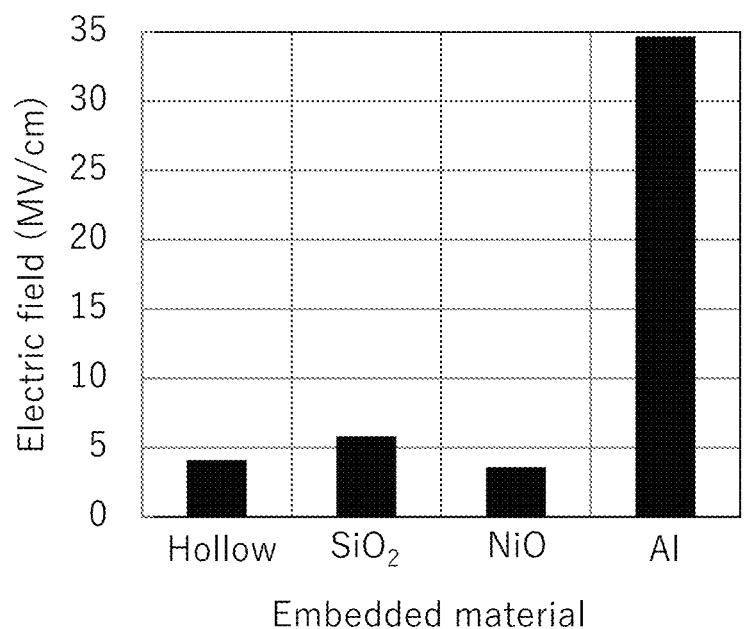
FIG. 19 is a graph indicating a simulation result of an Example 8.

FIG. 19 is a graph illustrating the simulation result of Example 8. The values in the graph of FIG. 19 denote the maximum values of the electric field strength at a part of the drift layer 30 that is covered with the semiconductor layer 70. As illustrated in FIG. 19, the electric field applied to the part covered with the semiconductor layer 70 is 4.1 MV/cm when the outer peripheral trench 10 is hollow, 5.8 MV/cm when the embedded layer 11 is made of $SiO_2$, 3.6 MV when the embedded layer 11 is made of NiO, and 34.7 MV/cm when the embedded layer 11 is made of Al.

Figure 20:
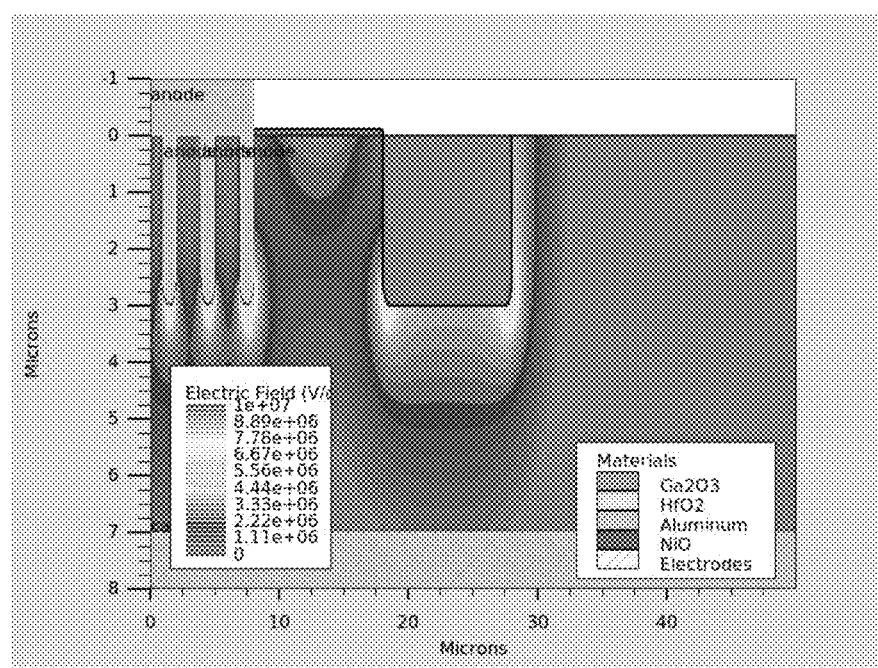
FIG. 20 is a diagram indicating a simulation result of an Example 8.

When the embedded layer 11 is made of NiO, the electric field is widely dispersed as illustrated in FIG. 20. In particular, the strength of the electric field applied to the area A significantly decreases (1 MV/cm or less).

REFERENCE SIGNS LIST

10 outer peripheral trench
11 embedded layer
20 semiconductor substrate
21 upper surface of semiconductor substrate
22 back surface of semiconductor substrate
30 drift layer
31 upper surface of drift layer
40 anode electrode
50 cathode electrode
60 center trench
60a center trench positioned at end portion
61 insulating film
70 semiconductor layer
100, 100a-100f, 200, 200a Schottky barrier diode
A-F area
G1-G3 gap

What is claimed is:

1. A Schottky barrier diode comprising:
a semiconductor substrate made of gallium oxide;
a drift layer made of gallium oxide and provided on the semiconductor substrate;
an anode electrode brought into Schottky contact with the drift layer; and
a cathode electrode brought into ohmic contact with the semiconductor substrate,
wherein the drift layer has an outer peripheral trench surrounding the anode electrode in a plan view, and
wherein a surface of the drift layer positioned between the anode electrode and the outer peripheral trench is covered with a semiconductor layer having a conductivity type opposite to that of the drift layer.

2. The Schottky barrier diode as claimed in claim 1, wherein the semiconductor layer is made of an oxide semiconductor material.

3. The Schottky barrier diode as claimed in claim 2, wherein the anode electrode and the semiconductor layer overlap each other.

4. The Schottky barrier diode as claimed in claim 2, wherein the outer peripheral trench is filled with an insulating material or a semiconductor material having a conductivity type opposite to that of the drift layer.

5. The Schottky barrier diode as claimed in claim 2, wherein the drift layer further has a plurality of center trenches formed at a position overlapping the anode electrode in a plan view.

6. The Schottky barrier diode as claimed in claim 5, wherein an inner wall of each of the plurality of center trenches is covered with an insulating film.

7. The Schottky barrier diode as claimed in claim 2, wherein the semiconductor layer comprises NiO.

8. The Schottky barrier diode as claimed in claim 1, wherein the anode electrode and the semiconductor layer overlap each other.

9. The Schottky barrier diode as claimed in claim 8, wherein a part of the anode electrode is formed on the semiconductor layer so as to cover an inner peripheral edge of the semiconductor layer.

10. The Schottky barrier diode as claimed in claim 1, wherein the outer peripheral trench is filled with an insulating material or a semiconductor material having a conductivity type opposite to that of the drift layer.

11. The Schottky barrier diode as claimed in claim 10, wherein the semiconductor layer comprises a same material as the semiconductor material filling the outer peripheral trench.

12. The Schottky barrier diode as claimed in claim 11, wherein the semiconductor layer is electrically connected to the semiconductor material filling the outer peripheral trench.

13. The Schottky barrier diode as claimed in claim 10, wherein the semiconductor layer is provided not to overlap the outer peripheral trench.

14. The Schottky barrier diode as claimed in claim 1, wherein the drift layer further has a plurality of center trenches formed at a position overlapping the anode electrode in a plan view.

15. The Schottky barrier diode as claimed in claim 14, wherein an inner wall of each of the plurality of center trenches is covered with an insulating film.

16. The Schottky barrier diode as claimed in claim 1, wherein the semiconductor layer comprises a p-type semiconductor material.

17. The Schottky barrier diode as claimed in claim 1, wherein the semiconductor layer is electrically connected to the anode electrode.

18. The Schottky barrier diode as claimed in claim 1, wherein the semiconductor layer is provided not to overlap the anode electrode.

* * * * *